(12) United States Patent
Ward, III et al.

(10) Patent No.: US 7,598,576 B2
(45) Date of Patent: *Oct. 6, 2009

(54) ENVIRONMENTALLY ROBUST PASSIVATION STRUCTURES FOR HIGH-VOLTAGE SILICON CARBIDE SEMICONDUCTOR DEVICES

(75) Inventors: Allan Ward, III, Durham, NC (US); Jason Patrick Henning, Carrboro, NC (US)

(73) Assignee: Cree, Inc., Durham, NC (US)

( * ) Notice: Subject to any disclaimer, the term of this patent is extended or adjusted under 35 U.S.C. 154(b) by 364 days.

This patent is subject to a terminal disclaimer.

(21) Appl. No.: 11/328,550

(22) Filed: Jan. 10, 2006

(65) Prior Publication Data

US 2007/0001176 A1    Jan. 4, 2007

Related U.S. Application Data

(63) Continuation-in-part of application No. 11/169,378, filed on Jun. 29, 2005.

(51) Int. Cl.
*H01L 29/15* (2006.01)
*H01L 31/0256* (2006.01)

(52) U.S. Cl. .................. 257/411; 257/76; 257/E21.055

(58) Field of Classification Search ................. 257/411, 257/76, E21.055
See application file for complete search history.

(56) References Cited

U.S. PATENT DOCUMENTS

| | | | |
|---|---|---|---|
| 3,982,267 A | 9/1976 | Henry | |
| 5,332,697 A | 7/1994 | Smith et al. | |
| 5,430,324 A | 7/1995 | Bencuya | |
| 5,605,852 A | 2/1997 | Bencuya | |
| 5,972,801 A | 10/1999 | Lipkin et al. | |
| 6,246,076 B1 | 6/2001 | Lipkin et al. | |
| 6,396,090 B1 | 5/2002 | Hsu et al. | |
| 6,426,542 B1 | 7/2002 | Tan | |
| 6,429,518 B1 | 8/2002 | Endo | |
| 6,437,371 B2 | 8/2002 | Lipkin et al. | |

(Continued)

FOREIGN PATENT DOCUMENTS

EP    1 149 934 A2    10/2001

(Continued)

OTHER PUBLICATIONS

Lipkin et al., Improved Oxidation Procedures for Reduced SiO2/SiC Defects; Journal of Electronic Materials; vol. 25, No. 5, 1996, pp. 909-915.

(Continued)

*Primary Examiner*—Marcos D. Pizarro
*Assistant Examiner*—Igwe U. Anya
(74) *Attorney, Agent, or Firm*—Summa, Additon & Ashe, P.A.

(57) ABSTRACT

An improved termination structure for high field semiconductor devices in silicon carbide is disclosed. The termination structure includes a silicon carbide-based device for high-field operation, an active region in the device, an edge termination passivation for the active region, in which the edge termination passivation includes, an oxide layer on at least some of the silicon carbide portions of the device for satisfying surface states and lowering interface density, a non-stoichiometric layer of silicon nitride on the oxide layer for avoiding the incorporation of hydrogen and for reducing parasitic capacitance and minimizing trapping, and, a stoichiometric layer of silicon nitride on the nonstoichiometric layer for encapsulating the nonstoichiometric layer and the oxide layer.

25 Claims, 4 Drawing Sheets

U.S. PATENT DOCUMENTS

| | | | |
|---|---|---|---|
| 6,528,373 | B2 | 3/2003 | Lipkin et al. |
| 6,586,781 | B2 | 7/2003 | Wu et al. |
| 6,610,366 | B2 | 8/2003 | Lipkin |
| 6,673,662 | B2 | 1/2004 | Singh |
| 6,767,843 | B2 | 7/2004 | Lipkin et al. |
| 6,797,586 | B2 | 9/2004 | Dev |
| 6,825,501 | B2 | 11/2004 | Edmond et al. |
| 2001/0028100 | A1 | 10/2001 | Schmitz et al. |
| 2003/0025121 | A1 | 2/2003 | Edmond et al. |
| 2003/0160274 | A1 | 8/2003 | Das et al. |
| 2003/0201453 | A2 | 10/2003 | Edmond |
| 2004/0099888 | A1* | 5/2004 | Sriram ................ 257/288 |
| 2004/0099928 | A1* | 5/2004 | Nunan et al. ......... 257/640 |
| 2004/0159865 | A1* | 8/2004 | Allen et al. .......... 257/280 |
| 2005/0097941 | A1* | 5/2005 | Sandvik et al. ....... 73/31.06 |
| 2005/0170574 | A1 | 8/2005 | Sheppard et al. |
| 2005/0258431 | A1 | 11/2005 | Smith et al. |
| 2006/0006415 | A1 | 1/2006 | Wu et al. |
| 2006/0043379 | A1* | 3/2006 | Zhang et al. ............ 257/77 |
| 2006/0043437 | A1* | 3/2006 | Mouli .................. 257/291 |
| 2006/0118892 | A1* | 6/2006 | Wu et al. .............. 257/412 |
| 2006/0145190 | A1 | 7/2006 | Salzman et al. |
| 2006/0157733 | A1 | 7/2006 | Lucovsky et al. |
| 2007/0001174 | A1* | 1/2007 | Ring et al. ............... 257/76 |

FOREIGN PATENT DOCUMENTS

WO    WO 2005076365    8/2005

OTHER PUBLICATIONS

G.Y. Chung et al., Effect of Nitric Oxide Annealing on the Inteface Trap Densities Near the Band Edges in the 4H Polytype of Silicon Carbide; Applied Physics Letters, vol. 76, No. 13, Mar. 2000, pp. 1713-1715.

H.F. Ll et al., Improving SiO2 Grown on P-Type 4H-SiC by NO Annealing; Materials Science Forum; vols. 264-268, 1998, pp. 869-872, 1998 Trans Tech Publications, Switzerland.

Lipkin et al., N2O Processing Improves the 4H-SiC:SiO2 Interface; Materials Science Forum; vols. 389-393, 2002, pp. 985-988, 2002 Trans Tech Publications, Switzerland.

J.J. Ganem et al, "NRA and XPS characterizations of layers formed by rapid thermal nitridation of thin SiO2 films," Nuclear instruments and Methods in Physics Research, vol. 1364, No. 1-4, 1992, Elsevier Science Publishers, Amsterdam, NL, pp. 744-749.

International Search Report for PCT/US2006/048817, Authorized Officer Pierre Favre, Date of Mailing: Jun. 25, 2007; 3 pgs.

Ohno Y et al: "Effect of surface passivation on breakdown of AlGaN/ Gan HEMTs," Compound Semiconductors, 2003, International Symposium, Aug. 25-27, 2003, Piscataway, NJ, pp. 169-170.

* cited by examiner

Fig. 7

ENVIRONMENTALLY ROBUST PASSIVATION STRUCTURES FOR HIGH-VOLTAGE SILICON CARBIDE SEMICONDUCTOR DEVICES

CROSS REFERENCE TO RELATED APPLICATIONS

This application is related to and is a continuation in part of Ser. No. 11/169,378 filed Jun. 29, 2005. The contents of this application are incorporated entirely herein by reference.

BACKGROUND

The present invention relates to silicon carbide (SiC) based semiconductor devices that operate at high voltage and thus in the presence of, or otherwise generate or experience, high electric fields. Such devices typically include, but are not necessarily limited to Schottky (rectifying) diodes, metal-oxide semiconductor field-effect transistors (MOSFETs); insulated gate bipolar transistors (IGBTs); PIN diodes; bipolar junction transistors (BJTs). For example (but not as a limitation), SiC-based power devices are advantageous for (switching) power supplies, motor control, power conditioning, hybrid vehicle technology, safety equipment, and power storage.

For electronic power devices, silicon carbide offers a number of physical, chemical and electronic advantages. Physically, the material is very hard and has an extremely high melting point, giving it robust physical characteristics. Chemically, silicon carbide is highly resistant to chemical attack and thus offers chemical stability as well as thermal stability. Perhaps most importantly, however, silicon carbide has excellent electronic properties, including high breakdown field, a relatively wide band gap (about 2.9 eV at room temperature for the 6H polytype), high saturated electron drift velocity, giving it significant advantages with respect to high power operation, high temperature operation, radiation hardness, and absorption and emission of high energy photons in the blue, violet, and ultraviolet regions of the spectrum.

For power applications, silicon carbide's wide bandgap results in a high impact ionization energy. In turn, this allows SiC to experience relatively high electric fields without avalanche multiplication of ionized carriers. By way of comparison, silicon carbide's electric field capacity is about ten times as great as that of silicon.

Because the active regions of these devices experience or generate such high electric fields, the devices typically must include some sort of termination structure to lessen the effects of the field ("field crowding") at the edge of the device. In common examples, the termination structure includes implanted regions in the silicon carbide adjacent the active region. Because the surface of the device must also be terminated, some sort of passivation structure is typically added to this surface. In most cases, the surface passivation structure can include a polymer (frequently polyimide) or a dielectric passivation such as silicon oxide, silicon nitride, or some combination of these, including non-stoichiometric oxides and non-stoichiometric nitrides (i.e., other than $SiO_2$ and $Si_3N_4$).

As SiC-based devices capable of handling higher voltages, and thus higher electric fields, have continued to be developed, it has been unexpectedly discovered that silicon carbide, which is normally chemically resistant to attack at temperatures below about 1500° C., will nevertheless oxidize at much lower temperatures in the presence of the high electric fields associated with these types of power electronic devices.

In particular, this oxidation is present in devices where significant transient current passes through the device such as in switching power devices. As best understood, this appears to be a otherwise conventional oxidation reduction reaction in which the presence of the electrons applied at the higher fields and at relatively higher frequencies encourages the oxidation to take place.

This unexpected and undesired oxidation of silicon carbide can take place at relatively modest operating temperatures; i.e., as low as 125° C. rather than the normally much higher temperatures required before silicon carbide will participate in a chemical reaction.

As the resulting undesired oxide grows, it expands and tends to lift the passivation layer away from the device, eventually degrading or eliminating its performance characteristics.

Conventional oxide passivation techniques also tend to exhibit drift at high electric fields. As set forth in the '378 application, at least some of this drift is attributed to the presence of hydrogen (present as hydrogen ions), which tend to drift toward the negative electrode, resulting in charge accumulation that reduces the blocking capacity of the device and the device's overall capabilities. The presence of hydrogen typically results from the use of plasma enhanced chemical vapor deposition (PECVD) to form the passivation structures, because many of the oxide precursors used in PECVD include hydrogen.

The problems discovered in this regard have been observed at field strengths as low as 250 kilovolts per centimeter (kV/cm), and are definitely evident at 500 kV/cm and above. Many SiC-based power devices experience fields as high as about 1.5 megavolts per centimeter (MV/cm).

Accordingly, devices that will take full advantage of the field strength characteristics of silicon carbide require passivation structures that can withstand such field strengths without undesired electronic behavior such as drift and without corrosive oxidation-reduction reactions such as the oxidation of silicon carbide to some stoichiometric or non-stoichiometric silicon oxide.

SUMMARY

The invention is an improved termination structure for high field semiconductor devices in silicon carbide. The structure comprises a silicon carbide-based device for high-field operation, an active region in said device, an edge termination passivation for said active region, in which said edge termination passivation includes, an oxide layer on at least some of the silicon carbide portions of the device for satisfying surface states and lowering interface density, a non-stoichiometric layer of silicon nitride on said oxide layer for avoiding the incorporation of hydrogen and for reducing parasitic capacitance and minimizing trapping, and, a stoichiometric layer of silicon nitride on the nonstoichiometric layer for encapsulating said nonstoichiometric layer and said oxide layer.

In another embodiment the invention is an improved termination structure for high field semiconductor devices in silicon carbide comprising a silicon carbide-based device for high-field operation, an active region in said device, an edge termination passivation for said active region, in which said edge termination passivation includes, an oxidation layer on the silicon carbide portions adjacent said active region for lowering the interface density between said silicon carbide portions and said oxidation layer, a first sputtered non-stoichiometric silicon nitride layer on said oxidation layer for reducing parasitic capacitance and minimizing device trapping, a second sputtered non-stoichiometric silicon nitride layer on said first layer for positioning subsequent passivation layers further from said substrate without encapsulating said structure, a sputtered stoichiometric silicon nitride layer on said second sputtered layer for encapsulating said structure and for enhancing the hydrogen barrier properties of the passivation layers, and a chemical vapor deposited environmental barrier layer of stoichiometric silicon nitride for step coverage and crack prevention on said encapsulant layer.

The foregoing and other objects and advantages of the invention and the manner in which the same are accomplished will become clearer based on the followed detailed description taken in conjunction with the accompanying drawings.

DETAILED DESCRIPTION

Figure 1:
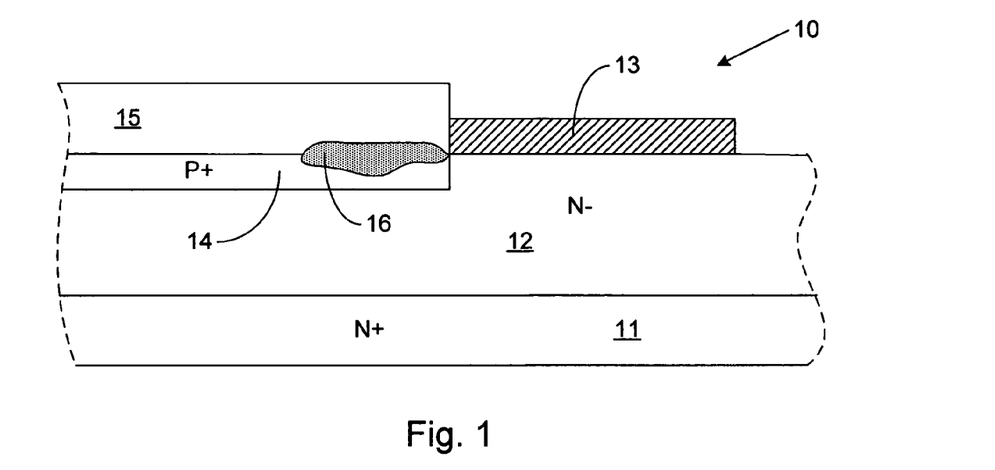
FIG. 1 is a cross sectional schematic diagram of a Schottky diode.

FIG. 1 is a cross sectional schematic diagram of a Schottky diode broadly designated at 10 and illustrating the recently-discovered problem addressed by the present invention. Although a Schottky diode is a relatively simple (fewer elements) electronic device and thus convenient for illustration purposes, it will be understood that the invention can be successfully incorporated in a variety of devices and is not limited to those described herein.

The diode 10 is formed on a silicon carbide substrate 11 which carries a silicon carbide epitaxial layer 12. A rectifying metal contact 13 complete the basic Schottky structure. In FIG. 1 the substrate 11 and the epilayer 12 are illustrated as n-type.

Although the term "edge" is used in a somewhat arbitrary fashion, for a Schottky diode, the edge of the device is functionally defined by the perimeter or border of the rectifying contact 13. Accordingly, in the diode illustrated in FIG. 1 an opposite conductivity type region 14 (i.e., opposite to the conductivity type of the semiconductor that forms the Schottky junction), typically formed by implantation, is adjacent the contact 13 at the surface of the epitaxial layer 12. FIG. 1 illustrates the portion 14 as p-type. A conventional passivation layer is illustrated at 15 and the problem described in the Background, namely the undesired growth of oxide, is illustrated by the shaded region 16. As schematically illustrated in FIG. 1, the continuing growth of the oxide portion 16 will tend to physically, chemically and electronically degrade the device's structure and performance.

Figure 2:
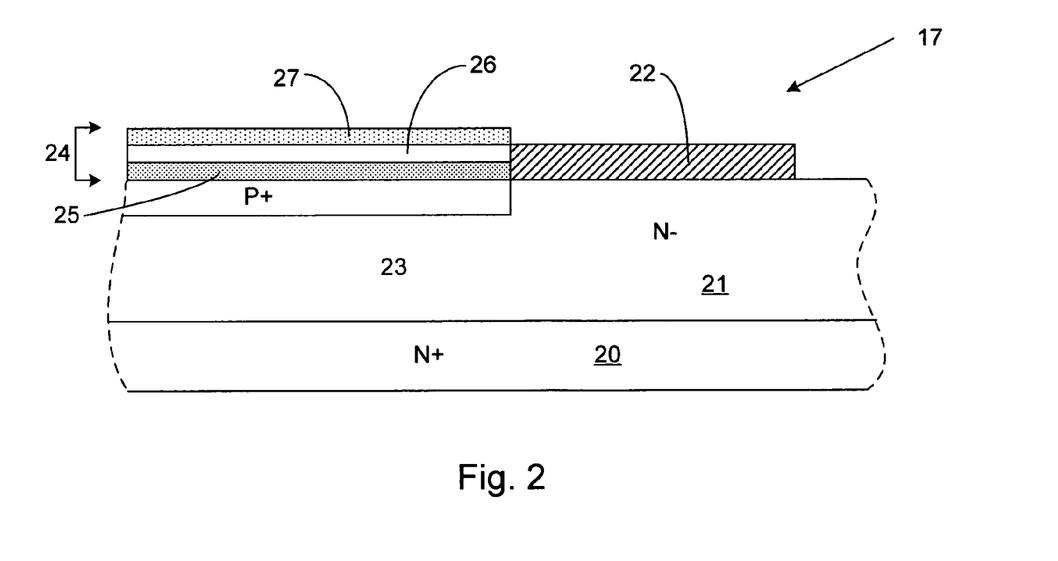
FIG. 2 is a schematic cross sectional diagram of a Schottky diode that incorporates the termination structure according to the invention.

FIG. 2 is a schematic cross sectional diagram of a Schottky diode broadly designated at 17 that incorporates the termination structure according to the invention. The diode 17 is a silicon carbide based device with a silicon carbide substrate 20 and a silicon carbide epitaxial layer 21. Generally, but not exclusively, in an n-type Schottky diode in silicon carbide, the substrate 20 will be doped slightly more heavily than the epitaxial layer 21 as indicated by the plus and minus symbols. A metal contact 22 formed of an appropriate Schottky metal forms the rectifying contact with the epitaxial layer 21. It will be understood that although the schematic diagrams herein show single metal layers in many circumstances, combinations of metals can be used for these contacts. For example, the contact 22 could be a Schottky metal such as nickel, chromium, titanium or platinum in rectifying contact with the silicon carbide, but could also carry a further metallic coating for some other purpose such as environmental protection or more convenient connection to a circuit.

The diode 17 also includes the p-type termination region 23 in the silicon carbide epilayer 21 and such termination regions are typically formed by ion implantation in a manner that is well understood by those of ordinary skill in this art.

The diode 17 includes an edge termination passivation portion 24 for the active region of the device. The edge termination 24 is positioned adjacent the Schottky contact 22, and includes an oxide layer 25 on at least some available of the silicon carbide portions of the diode 17 for satisfying surface states and lowering interface density. A nonstoichiometric silicon nitride layer 26 is on the oxide layer for avoiding the incorporation of hydrogen and for reducing parasitic capacitance and minimizing trapping. A stoichiometric layer of silicon nitride 27 ($Si_3N_4$) is on the nonstoichiometric layer 26 for encapsulating the nonstoichiometric layer 26 and the oxide layer against environmental attack.

Silicon carbide wafers, including wafers with epitaxial layers, are commercially available, and are specifically available from the present assignee, Cree, Inc., Durham N.C. Thus the substrate and the epitaxial layer can be obtained and used by those of ordinary skill in this art without undue experimentation. In exemplary embodiments the substrate 20 and the epitaxial layer 21 are single crystal and have a polytype selected from the group consisting of the 3C, 4H, 6H, and 15R poly types of silicon carbide.

In exemplary embodiments and for a number of appropriate reasons, the oxide layer 25 in the termination passivation structure 24 is typically a thermally grown oxide. Such layers are also referred to as "thermal oxidation" layers or as "oxidized" layers in which the term oxidized is used as an adjective as well as a verb. Such usage is common in the art and is understood in context by those of ordinary skill in this art. In exemplary embodiments, the thermal oxidation layer 25 is silicon dioxide, usually stoichiometric ($SiO_2$), with a thickness of between about 100 and 500 angstroms.

As set forth in the Background, one of the problems with silicon nitride passivation layers is their incorporation of hydrogen. With respect to certain semiconductor wide bandgap devices (such as the Group III nitrides discussed in the '378 parent application), the presence of hydrogen can affect the doping characteristics of the semiconductor. In silicon carbide based devices, the presence of hydrogen in the passivation structure can also adversely cause drift. Accordingly, the nonstoichiometric silicon nitride layer 26 is substantially hydrogen free and is sputter deposited in order to avoid the incorporation of hydrogen. By way of comparison, chemical vapor deposited silicon nitride typically includes hydrogen because of hydrogen's presence in the CVD precursor gases. In exemplary embodiments, the nonstoichiometric layer 26 is between about 1000 and 2000 angstroms thick.

As further set forth in the parent application, the atomic ratio of the nonstoichiometric (i.e., other than $Si_3N_4$) silicon nitride is expressed in a refractive index different from the refractive index of stoichiometric silicon nitride (which is 2.02 measured at a standard wavelength of 6328 Å). Accordingly, the nonstoichiometric silicon nitride layer has a refractive index of between about 1.85 and 1.95, which represents a nitrogen-rich composition (as compared to stoichiometric).

Figure 3:
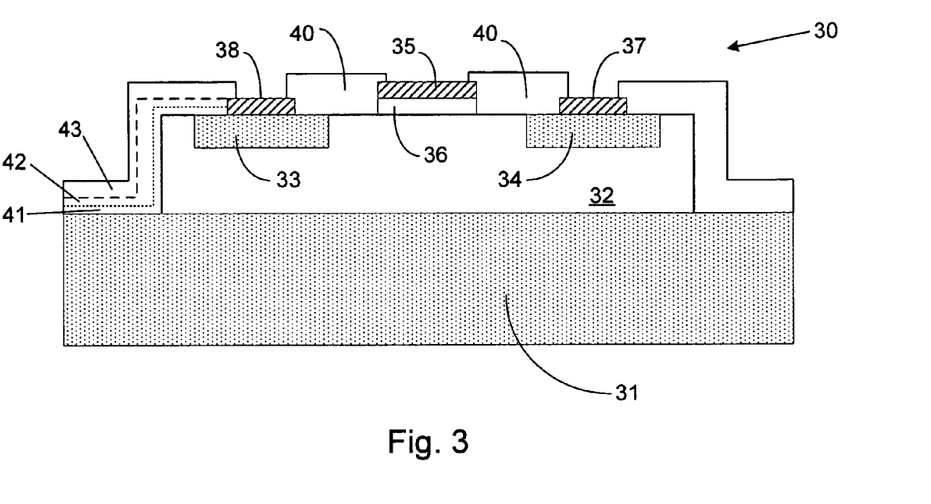
FIG. 3 is a cross-sectional schematic diagram of a metal oxide semiconductor field effect transistor (MOSFET) that incorporates the passivation of the present invention.

FIG. 3 is a cross-sectional schematic diagram of a metal oxide semiconductor field effect transistor (MOSFET) broadly designated at 30 that incorporates the passivation of the present invention. The MOSFET 30 includes a silicon carbide substrate 31 having a first conductivity type and an epitaxial layer 32 of silicon carbide of the opposite conductivity type. FIG. 3 illustrates the MOSFET in a planar, mesa-type orientation, but it will be understood that this is exemplary for purposes of illustration and not limiting of the manner or type of MOSFET into which the invention can be incorporated.

A source region 33 and a drain region 34 are formed of first conductivity type silicon carbide; i.e. the same conductivity type as the substrate. A gate contact 35 and a gate oxide 36 define the gate region of the transistor 30 and the source contact 38 and the drain contact 37 are formed of appropriate ohmic metals.

The passivation structure according to the present invention can be incorporated at a number of locations in or adjacent the MOSFET 30 and in FIG. 3 the passivation is designated at 40; i.e. adjacent one or more of the source 38, gate 35, or drain 37 contacts. In more detail, the oxide layer is illustrated in the left-hand portion of FIG. 3 at 41, the nonstoichiometric nitride layer at 42, and the stoichiometric oxide layer at 43. It will be understood that the other portions have the same three-part structure as illustrated in the left-hand portion of FIG. 3.

When the epitaxial layer of 32 is p-type, the MOSFET is referred to as a p-channel MOSFET with n-type source and drain portions 33 and 34. As well understood in the art, an n-channel MOSFET incorporates an n-type epitaxial layer 32 and the source and drain portions 33 and 34 would be p-type.

Figure 4:
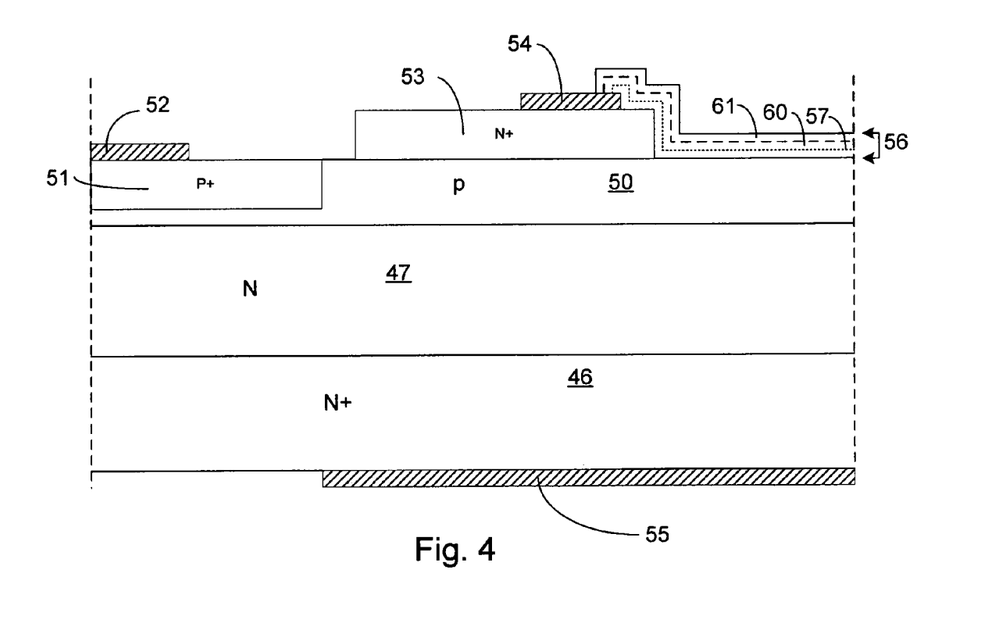
FIG. 4 is a schematic half cell illustration of a bipolar junction transistor (BJT) that incorporates the passivation according to the present invention.

FIG. 4 is a schematic half cell illustration of a bipolar junction transistor (BJT) broadly designated at 45 with a backside collector that incorporates the passivation according to the present invention. The BJT 45 is formed on a silicon carbide substrate (potentially including a wafer) 46 and a silicon carbide drift region 47 adjacent to the substrate 46. The substrate 46 and the drift region 47 have the same conductivity type and are illustrated in FIG. 4 as n-type with the substrate 46 being slightly more heavily doped than the drift region 47. A base region 50 is formed of the opposite conductivity type (p-type in FIG. 4) with the portion 51 adjacent the base collector metal 52 being slightly more heavily doped than the remainder of the base region 50. An emitter portion 53 and corresponding contact 54 together with the collector contact (on the backside) 55 complete the half cell structure.

The passivation is adjacent one or more of the emitter 54, base 52 or collector 52 contacts. In the device orientation illustrated in FIG. 4 the passivation 56 is illustrated adjacent the emitter contact 54. As in the previous embodiments, the passivation termination structure is formed of the oxide layer 57, the nonstoichiometric silicon nitride layer 60, and the stoichiometric silicon nitride layer 61. FIG. 4 illustrates and n-p-n bipolar junction transistor but the invention can also be used in conjunction with a p-n-p bipolar junction transistor which would have the conductivity types reversed in the relevant portions of the structure.

Figure 5:
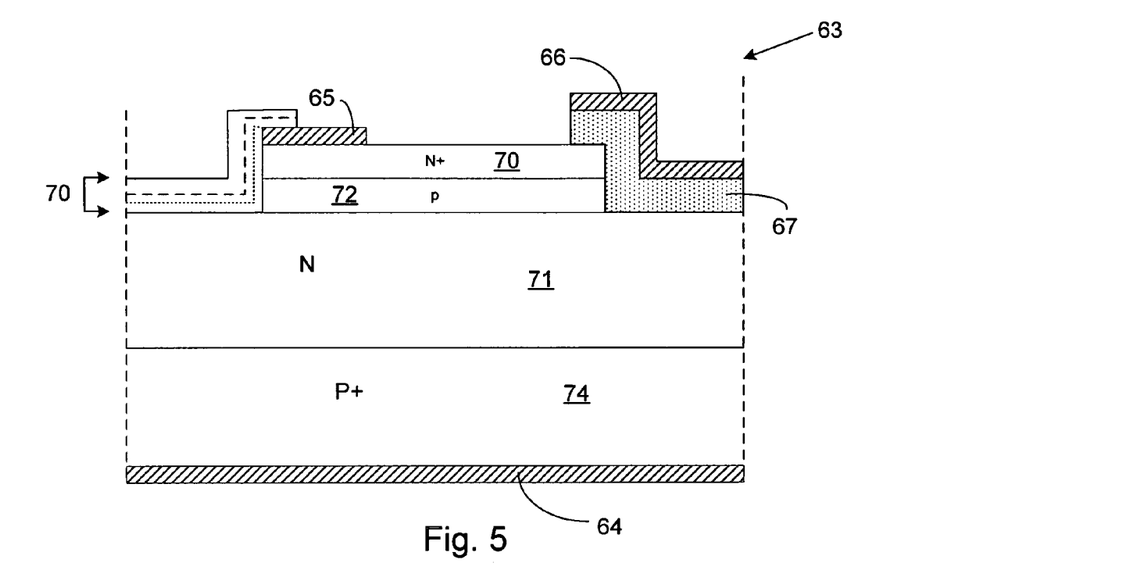
FIG. 5 is a cross-sectional schematic half cell representation of an insulated gate bipolar transistor (IGBT) that incorporates the termination passivation according to the present invention.

FIG. 5 is a cross-sectional schematic half cell representation of an insulated gate bipolar transistor (IGBT) broadly designated at 63 that incorporates the termination passivation according to the present invention. The transistor 63 is oriented with the collector contact 64 on the backside of the device opposite the emitter contact 65 and the gate contact 66. As illustrated in FIG. 5, the IGBT 63 forms an equivalent circuit as p-n-p bipolar transistor with a MOSFET gate drive. The gate oxide is illustrated at 67, the respective n-type portions at 70 and 71 (the drift region), and the p-type regions at 72 and 74 (the p-type substrate).

The edge termination passivation 70 is adjacent at least one of (and depending upon the orientation, each of) the emitter 65, gate 66 or collector 64 contacts. FIG. 5 illustrate the termination passivation 70 adjacent the emitter contact 65. The transistor illustrated in FIG. 5 includes the n-type drift region 71, but the transistor can be configured with a p-type drift region as well as understood by those of skill in this art.

Figure 6:
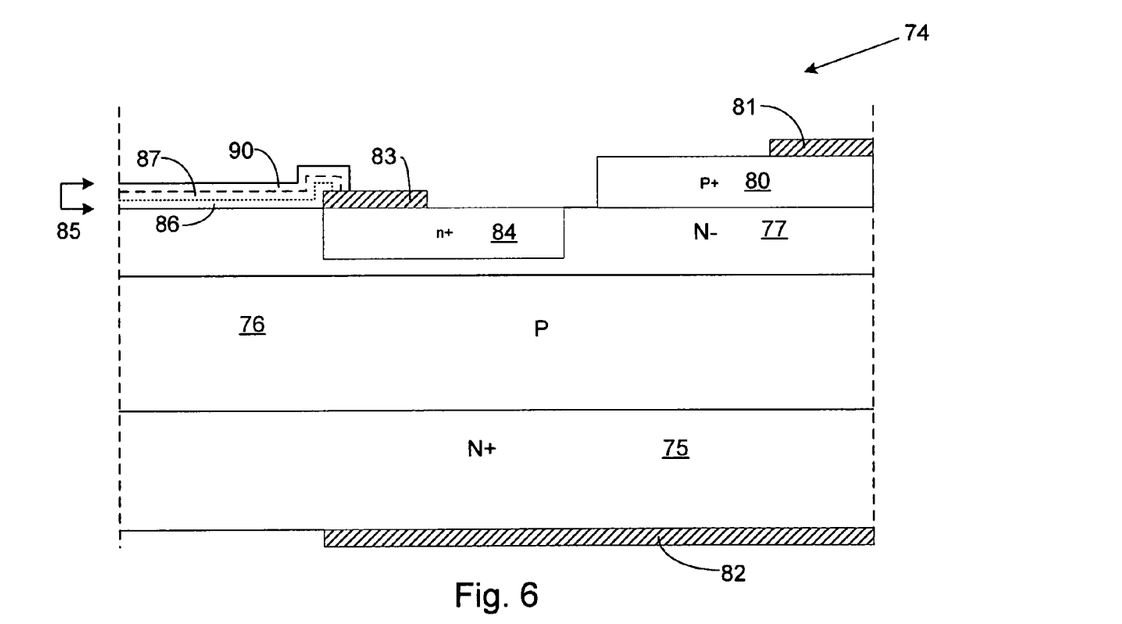
FIG. 6 is a cross-sectional schematic diagram of a thyristor according to the present invention.

FIG. 6 is a cross-sectional schematic diagram (half-cell) of a thyristor broadly designated at 74 according to the present invention. In the orientation of FIG. 6, the respective four regions (two p-type and two n-type) are illustrated as the n-type substrate (or wafer 75) the p-type drift region 76, the n-type epilayer 77, and the p-type layer 80. An anode contact 81 is made to the p epitaxial layer 80 and a cathode contact 82 is made to the n-type substrate 75. A metal gate contact 83 defines the gate portion which, as illustrated in FIG. 6, can be doped slightly more heavily in one area 84 than the remainder of the n-type epitaxial layer 77.

In a thyristor according to the invention, the edge termination passivation 85 is adjacent at least one of, and potentially each of, the anode 81, cathode 82, or gate 83 contacts, and includes the oxide layer 86, the nonstoichiometric silicon nitride layer 87, and the stoichiometric encapsulation silicon nitride layer 90.

Figure 7:
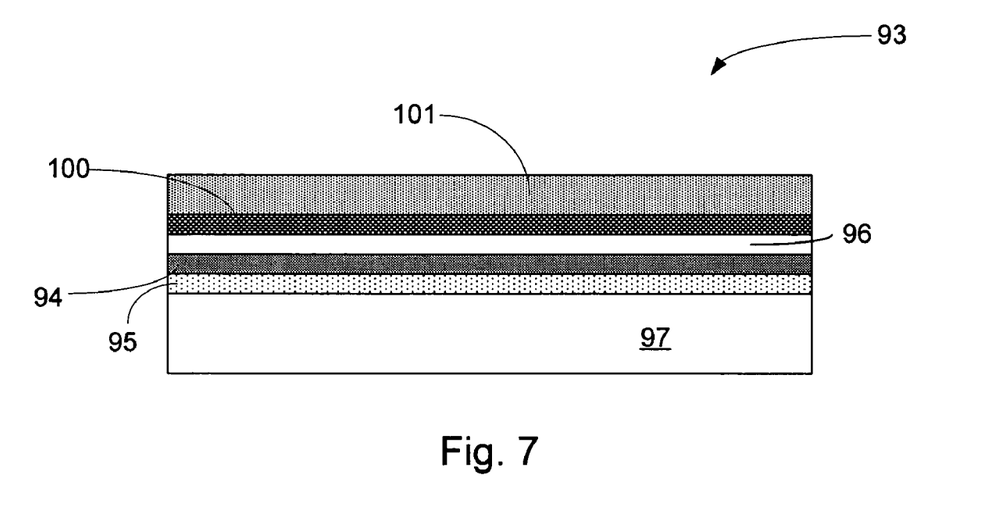
FIG. 7 illustrates a more detailed embodiment of the passivation structure according to the present invention.

FIG. 7 illustrates a more detailed embodiment 93 of the passivation structure according to the present invention. This more detailed structure can be incorporated in any one or more of the device structures just described.

In FIG. 7, a first sputtered nonstoichiometric layer 94 is on the thermal oxidation layer 95 for reducing parasitic capacitance and minimizing device trapping. A second sputtered non-stoichiometric silicon nitride layer 96 is on the first layer 94 for positioning subsequent passivation layers further from the substrate 97, but without fully encapsulating the structure 93. A sputtered stoichiometric silicon nitride layer 100 is on the second sputtered nonstoichiometric layer 96 for initially encapsulating the structure 93 and for enhancing the hydrogen barrier properties of the passivation layers. The chemical vapor deposited environmental barrier layer 101 covers the device to provide step coverage and crack prevention.

In somewhat greater detail, the thermal oxidation layer 95 is stoichiometric silicon dioxide ($SiO_2$) with a thickness in exemplary embodiments of between about 100 and 500 angstroms (Å). This is a sufficient thickness to provide the electronic benefits of the oxide (as opposed to a nitride-only passivation), but less than a thickness that would raise additional manufacturing problems.

As set forth elsewhere herein, the nature of sputtering is such that it provides a silicon nitride layer that is substantially hydrogen-free. Thus layers 94, 96 and 100 are advantageously substantially hydrogen free.

The first two sputtered layers 94 and 96 are preferentially nitrogen-rich. As noted earlier, the proportion of silicon or nitrogen (in a non-stoichiometric composition) can be determined by the refractive index, which is an indicator of the composition of the formed silicon nitride film.

Accordingly, in exemplary embodiments each of the non-stoichiometric sputtered silicon nitride layers 94 and 96 have a refractive index of between about 1.85 and 1.95.

The silicon carbide substrate is often a single crystal and has a polytype selected from the group consisting of the 3C, 4H, 6H and 15R polytypes of silicon carbide.

One purpose of sputtering is to avoid the presence of hydrogen as described elsewhere herein, and to correspondingly avoid the electronic problems associated with the presence of hydrogen. Accordingly, the sputtered layers described with respect to FIG. 7 can also be understood as hydrogen-free layers. Stated differently, sputtering is one technique for producing a hydrogen-free passivation layer. The invention, however, can also be understood as the hydrogen free passivation layer regardless of its method of manufacture.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. An improved termination structure for high field semiconductor devices in silicon carbide comprising:
    a silicon carbide-based device for high-field operation;
    an active region in said device;
    an edge termination passivation for said active region, in which said edge termination passivation includes,
    an oxide layer on at least some of the silicon carbide portions of said device for satisfying surface states and lowering interface density,
    a non-stoichiometric layer of silicon nitride on said oxide layer for avoiding the incorporation of hydrogen and for reducing parasitic capacitance and minimizing trapping, and,
    a stoichiometric layer of silicon nitride on said nonstoichiometric layer for encapsulating said nonstoichiometric layer and said oxide layer.

2. A termination structure according to claim 1 comprising silicon carbide portions that are single crystal and that have a polytype selected from the group consisting of the 3C, 4H, 6H, and 15R polytypes of silicon carbide.

3. A semiconductor device that incorporates the termination structure of claim 1, said device being selected from the group consisting of Schottky diodes, metal-oxide semiconductor field-effect transistors, insulated gate bipolar transistors, PIN diodes, bipolar junction transistors and thyristors.

4. A Schottky diode according to claim 3 wherein said active region comprises:
    a Schottky metal on a silicon carbide epitaxial layer; and
    a silicon carbide substrate supporting said epitaxial layer.

5. A Schottky diode according to claim 4 wherein said silicon carbide epitaxial layer and said silicon carbide substrate are both n-type; and
    said Schottky metal is selected from the group consisting of nickel, chromium, titanium, and platinum.

6. A termination structure according to claim 1 wherein said oxide layer is a thermal oxidation layer.

7. A termination structure according to claim 6 wherein said thermal oxidation layer is silicon dioxide with a thickness of between about 100 and 500 angstroms.

8. A termination structure according to claim 1 wherein said non-stoichiometric silicon nitride layer is substantially hydrogen free.

9. A termination structure according to claim 1 wherein said non-stoichiometric silicon nitride layer is between about 1000 and 2000 angstroms thick.

10. A termination structure according to claim 1 wherein said non-stoichiometric silicon nitride layer has a refractive index of between about 1.85 and 1.95.

11. A termination structure according to claim 1 wherein said stoichiometric silicon nitride layer is substantially hydrogen free.

12. An improved termination structure for high field semiconductor devices in silicon carbide comprising:
    a silicon carbide-based device for high-field operation;
    an active region in said device;
    an edge termination passivation for said active region, in which said edge termination passivation includes,
    an oxidation layer on the silicon carbide portions adjacent said active region for lowering the interface density between said silicon carbide portions and said oxidation layer;
    a first sputtered non-stoichiometric silicon nitride layer on said oxidation layer for reducing parasitic capacitance and minimizing device trapping;
    a second sputtered non-stoichiometric silicon nitride layer on said first layer for positioning subsequent passivation layers further from said substrate without encapsulating said structure;
    a sputtered stoichiometric silicon nitride layer on said second sputtered layer for encapsulating said structure and for enhancing the hydrogen barrier properties of the passivation layers; and
    a chemical vapor deposited environmental barrier layer of stoichiometric silicon nitride for step coverage and crack prevention on said encapsulant layer.

13. A passivated semiconductor structure according to claim 12 wherein said oxidation layer is a thermal oxidation layer.

14. A passivated semiconductor structure according to claim 12 wherein said thermal oxidation layer is silicon dioxide with a thickness of between about 100 and 500 angstroms.

15. A passivated semiconductor structure according to claim 12 wherein said first silicon nitride layer is substantially hydrogen free.

16. A passivated semiconductor structure according to claim 12 wherein said first silicon nitride layer is between about 1000 and 2000 angstroms thick.

17. A passivated semiconductor structure according to claim 12 wherein said first silicon nitride layer has a refractive index of between about 1.85 and 1.95.

18. A passivated semiconductor structure according to claim 12 wherein said second silicon nitride layer is substantially hydrogen free.

19. A passivated semiconductor structure according to claim 12 wherein said second silicon nitride layer is between about 1000 and 3000 angstroms thick.

20. A passivated semiconductor structure according to claim 12 wherein said second silicon nitride layer has a refractive index of between about 1.85 and 1.95.

21. A passivated semiconductor structure according to claim 12 wherein said stoichiometric encapsulating layer is between about 1000 and 3000 angstroms thick.

22. A passivated semiconductor structure according to claim 12 wherein said encapsulating layer is substantially hydrogen free.

23. A passivated semiconductor structure according to claim 12 wherein said environmental baffler layer is between about 2000 and 5000 angstroms.

24. A passivated semiconductor structure according to claim 12 wherein said environmental barrier layer and said encapsulating layer both comprise $Si_3N_4$.

25. A passivated semiconductor structure according to claim 12 wherein said silicon carbide substrate is a single crystal having a polytype selected from the group consisting of the 3C, 4H, 6H, and 15R polytypes of silicon carbide.

* * * * *

UNITED STATES PATENT AND TRADEMARK OFFICE
CERTIFICATE OF CORRECTION

PATENT NO. : 7,598,576 B2  Page 1 of 1
APPLICATION NO. : 11/328550
DATED : October 6, 2009
INVENTOR(S) : Allan Ward, III and Jason Patrick Henning It is certified that error appears in the above-identified patent and that said Letters Patent is hereby corrected as shown below:

Col. 10 Line 7 in the Claims INSERT:

--37. A MOSFET according to Claim 3 comprising respective source, gate and drain contacts; and said edge termination passivation being adjacent at least one of said contacts.

38. A p-channel MOSFET according to claim 37.

39. An n-channel MOSFET according to claim 37.

40. A bipolar junction transistor according to Claim 3 comprising respective base, emitter, and collector contacts and;
said edge termination passivation being adjacent at least one of said contacts.

41. A n-p-n bipolar junction transistor according to Claim 40.

42. A p-n-p bipolar junction transistor according to Claim 40.

43. An insulated gate bipolar transistor according to Claim 3 comprising respective base, emitter, and collector contacts; and
said edge termination passivation being adjacent at least one of said contacts.

44. An insulated gate bipolar transistor according to Claim 43 comprising an n-type drift region.

45. An insulated gate bipolar transistor according to Claim 43 comprising a p-type drift region.

46. A thyristor according to Claim 3 comprising respective anode, cathode and gate contacts; and
said edge termination passivation being adjacent at least one of said contacts.

47. A p-i-n diode according to Claim 3 comprising respective anode and cathode contacts; and said edge termination passivation being adjacent at least one of said anode and cathode contacts.--

Signed and Sealed this

Sixth Day of April, 2010

David J. Kappos
*Director of the United States Patent and Trademark Office*